(12) United States Patent
Watanabe

(10) Patent No.: US 6,292,914 B1
(45) Date of Patent: Sep. 18, 2001

(54) SEMICONDUCTOR MEMORY CAPABLE OF VERIFYING STORED DATA

(75) Inventor: Kenichi Watanabe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/140,335

(22) Filed: Aug. 26, 1998

(30) Foreign Application Priority Data

Sep. 5, 1997 (JP) .................................................... 9-257716

(51) Int. Cl.[7] .................................................. G11C 29/00
(52) U.S. Cl. ............................................................ 714/721
(58) Field of Search .................................. 714/718, 719, 714/721

(56) References Cited

U.S. PATENT DOCUMENTS

| | | | | |
|---|---|---|---|---|
| 4,737,936 | * | 4/1988 | Takeuchi | 365/185.22 |
| 5,072,137 | * | 12/1991 | Slemmer | 326/16 |
| 5,175,655 | * | 12/1992 | Satomura | 360/53 |
| 5,321,699 | * | 6/1994 | Endoh et al. | 365/185.17 |
| 5,463,637 | * | 10/1995 | Hayashi | 714/718 |
| 5,602,789 | * | 2/1997 | Endoh et al. | 365/185.03 |
| 5,675,540 | * | 10/1997 | Roohparvar | 365/185.22 |
| 5,737,339 | * | 4/1998 | Goto et al. | 714/719 |
| 5,961,653 | * | 10/1999 | Kalter et al. | 714/7 |
| 6,219,280 | * | 4/2001 | Naganawa | 365/185.22 |

* cited by examiner

Primary Examiner—Albert Decady
Assistant Examiner—Joseph Torres
(74) Attorney, Agent, or Firm—Jones Volentine, PLLC

(57) ABSTRACT

In a semiconductor memory capable of verifying data stored therein, a verification pass signal output from a verification circuit is input to a control signal output circuit. In the case of a normal mode operation of the control signal output circuit, a signal having a voltage level corresponding to that of the verification pass signal is output therefrom. In the case of a test mode operation of the control signal output circuit, a signal having a given voltage level regardless of voltage level of the verification pass signal is output therefrom. In cases where the signal having the given voltage level is output from the control signal output circuit, a write control circuit and a write counter execute a preset maximum number of program processings and verifications processing.

17 Claims, 7 Drawing Sheets

SEMICONDUCTOR MEMORY CAPABLE OF VERIFYING STORED DATA

BACKGROUND OF THE INVENTION

1. Field of the Invention

The invention relates to a semiconductor memory, particularly to a nonvolatile memory having functions of electrically rewriting and of verifying data stored therein.

2. Description of the related art

For a semiconductor memory, there are a random access memory capable of freely reading and writing data and a read only memory used specifically for reading data which is written in advance. The read only memory is generally composed of a nonvolatile semiconductor memory. For the read only memory, there is a type capable of electrically rewriting data. Such a memory includes a memory capable of erasing data at a time, namely, by the batch.

The memory capable of electrically rewriting data includes a type having a function of verifying whether a threshold voltage of a memory cell on which data is written is a given voltage or not when given data is written (sometimes called programmed) on a memory cell array composed of a plurality of memory cells incorporated in this memory.

A verification processing using this verification function is executed, for example by a program processing of given data. The verification processing is executed every time given data is written on a memory cell. If it is detected in the verification processing that a memory cell on which data is written does not reach a given threshold, the program processing and verification processing are executed again. Until a memory cell on which data is written reaches a given threshold voltage, the given number of program processing and verification processing are repeatedly executed. If the given number of verification processing is executed and a memory cell on which data is written does not reach a given threshold voltage, program processing is terminated by designating a failure in the program processing.

A demand for representing the maximum value of time needed for a program processing has been recently increased with a warranty of manufacturers of memories. However, the maximum value of time is differentiated depending on the memories and how may times the program processing and verification processing are executed, thus impacting on the termination of the program processing. Accordingly, it scarcely occurs that all memories can execute the preset given number (the maximum number) of program processing and verification processing. Accordingly, it is required that the maximum value of time needed for executing program processing, namely, the time when the preset given number of program processing and verification processing are executed can be measured.

Further, memory has progressed to a high degree of integration, and thus miniaturization of chip size. Accordingly, it is necessary to avoid the sharp increase of the number of circuit configurations in order to measure the maximum value of time needed for executing the program processing. It is further necessary not to impede a normal operation of a memory by a circuit capable of measuring the maximum value of time needed for programming data.

It is another object of the invention to provide a semiconductor memory capable of attaining the above object without sharply increasing the number of circuit configurations.

It is still another object of the invention to provide a semiconductor memory capable of attaining the above object without impeding a normal operation of the memory.

SUMMARY OF THE INVENTION

To achieve the above objects, a semiconductor memory capable of verifying data stored therein according to the invention comprises a memory cell array comprising a plurality of memory cells in which given data can be stored, a verification circuit for verifying data stored in the memory cell array and outputting a fit signal for instructing the result of verification, a control signal output circuit for receiving the fit signal and outputting a second control signal having a voltage level which is selectively controlled to a voltage level corresponding to a voltage level of the fit signal or a first voltage level in response to a first control signal, and a counter for counting the number of verification processing of data by the verification circuit, wherein the counter is capable of updating the number of verification processing if a voltage level of a count signal is in the first voltage level.

Further, the semiconductor memory of the invention may include a write control circuit for outputting a write signal for instructing writing of data on the memory cell array, wherein the write control circuit continues to write data on the memory cell array when the second control signal is in the first voltage level.

Further, the semiconductor memory of the invention may have a status instruction circuit for outputting a signal representing an output status of the write signal.

Further, the semiconductor memory of the invention may be structured that the control signal output circuit includes a logic circuit for receiving the first control signal and the fit signal, wherein the logic circuit outputs a signal for rendering a voltage level of the second control signal to be the first voltage level when a voltage level of the first control signal is the second voltage level, and for rendering a voltage level of the second control signal to be a voltage level corresponding to a voltage of the fit signal when the voltage level of the first control signal is a third voltage level.

Further, the semiconductor memory of the invention may be structured that the counter outputs an instruction signal for instructing that the count value exceeds preset given number, and the write control circuit is controlled by the instruction signal.

Further, the semiconductor memory of the invention may be structured that the generation circuit can change the voltage level of the first control signal when the semiconductor memory is powered on.

Further, the semiconductor memory of the invention may be structured that the control signal output circuit includes a generation circuit for generating the first control signal, wherein the generation circuit generates a first control signal having a given voltage level in response to the selected signal.

Further, the semiconductor memory of the invention may be structured that the generation circuit can change the voltage level of the first control signal when the semiconductor memory is powered on.

Further, the semiconductor memory of the invention may be structured that the first control signal is inputted from one of pads provided in a semiconductor chip constituting the semiconductor memory, wherein the pad is not connected to an external terminal in a packaged state.

Further, the semiconductor memory of the invention may be structured that the semiconductor memory has a status instruction circuit for outputting a signal representing an output status of the write signal.

Further, the semiconductor memory of the invention may be structured that the status signal is connected to a terminal provided on the semiconductor memory.

Further, the semiconductor memory of the invention may be structured that the counter counts based on a status of a signal outputted from the write control circuit when writing data.

DETAILED DESCRIPTION OF THE PREFERRED EMBODIMENTS

Figure 1:
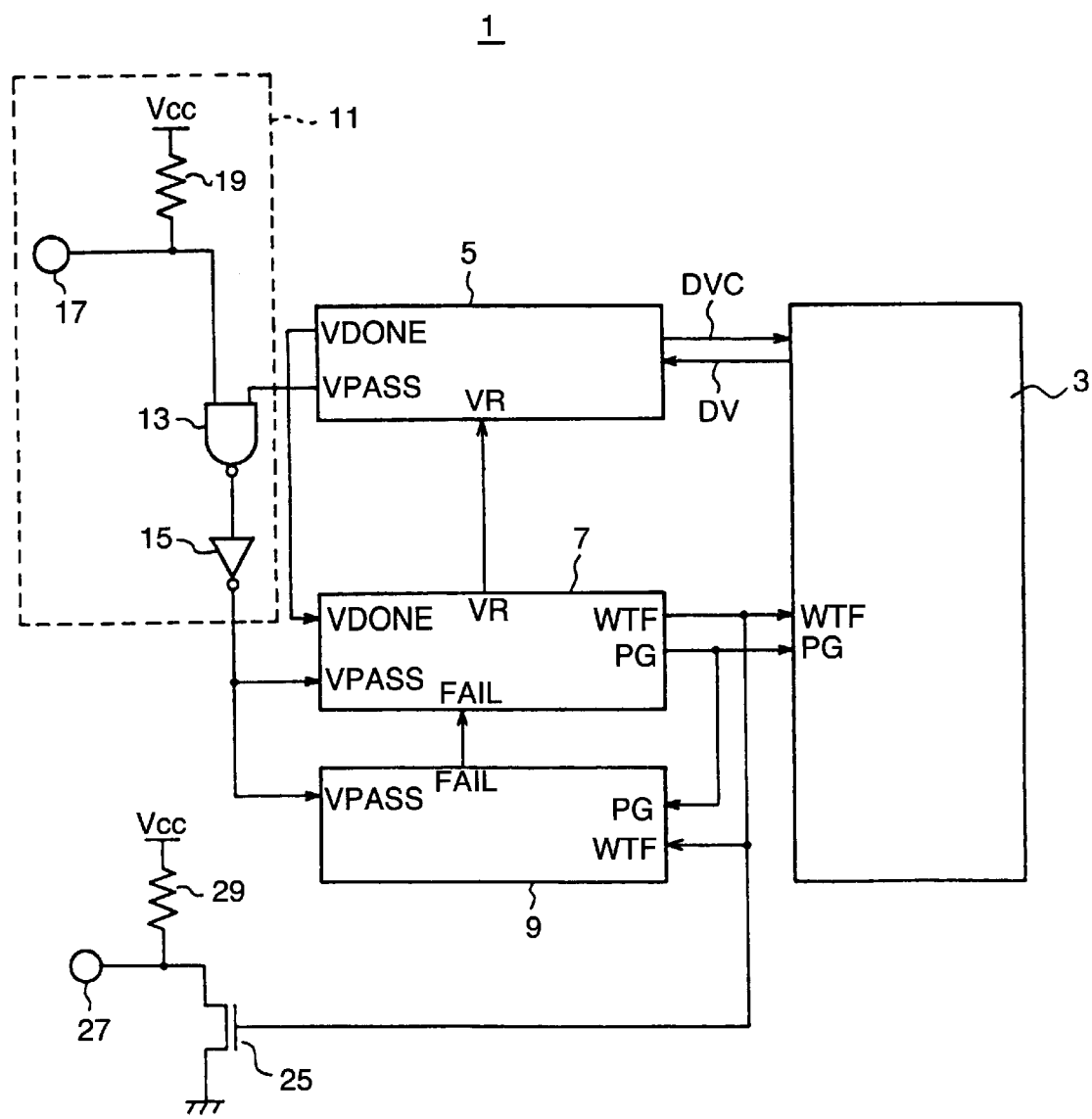
FIG. 1 is a block diagram showing the construction of a semiconductor memory according to a first embodiment of the invention.

A semiconductor memory according to the invention will be now described with reference to the accompanied drawings. Components which have substantially the same functions and constructions in the embodiments set forth hereafter are denoted by the same reference numerals to omit the overlapping explanation.

[First Embodiment]

The construction of a semiconductor memory according to a first embodiment of the invention is illustrated in FIG. 1. A semiconductor memory 1 is a nonvolatile semiconductor memory capable of erasing data by the batch.

The semiconductor memory 1 comprises a memory cell array 3 composed of a plurality of memory cells, a verification circuit 5 capable of verifying data, a write control circuit 7, a write counter 9 serving as a counter, a resistor element 29 and a transistor 25 respectively constituting a status instruction circuit, and a control signal output circuit 11 for rendering a fit signal outputted from the verification circuit 5 invalid.

The write control circuit 7 outputs a data write status signal WTF for instructing writing of data on the memory cell array 3 and the write counter 9, a data program signal PG for writing (programming) data on the memory cell array 3, and a verification signal VR for instructing a verification processing to the verification circuit 5. The data write status signal WTF is also inputted to a gate electrode of the transistor 25. The write control circuit 7 is controlled in write operation in response to a voltage level of an output signal of the control signal output circuit 11 serving as a second control signal. The write control circuit 7 is controlled to an inhibition state where a write processing is inhibited by a data program fail signal FAIL which is outputted from the write counter 9.

The verification circuit 5 verifies data which is stored in the memory cell array 3. The verification circuit 5 is activated by a verification signal VR outputted from the write control circuit 7. The activated verification circuit 5 outputs a data voltage level check signal DVC for instructing the verification of data (read instruction of data) which is stored in the memory cell array 3. The memory cell array 3 outputs a data voltage level signal DV corresponding to the voltage level of stored data relative to the verification circuit 5 upon reception of the data voltage level check signal DVC.

The verification circuit 5 outputs a verification terminal signal VDONE for instructing the termination of the verification processing to the write control circuit 7. The verification circuit 5 further outputs a verification pass signal VPASS serving as a fit signal representing the result of the verification processing.

The write counter 9 is activated upon reception of the data write status signal WTF, and counts the data program signal PG. The count value is reset in response to the voltage level of the output signal of the control signal output circuit 11 serving as the second control signal. The write counter 9 can set data for instructing the maximum number of program processings. Assume that data for instructing the maximum number of program processings, e.g., eight times is set in the write counter 9. When the count value exceeds eight times, the write counter 9 outputs the data program fail signal FAIL to the write control circuit 7.

The control signal output circuit 11 comprises a NAND gate 13, an inverter 15, and a resistor element 19. The verification pass signal VPASS is inputted to a first input terminal of the NAND gate 13, and a second input terminal of the NAND gate 13 is connected to one terminal of the resistor element 19 and a pad 17. A power supply voltage Vcc is applied to another terminal of the resistor element 19. An output of the NAND gate 13 is connected to an input terminal of the inverter 15. An output of the inverter 15 becomes the output signal of the control signal output circuit 11.

The control signal output circuit 11 having the construction as set forth above operates as follows. When the pad 17 is in a release state (in a state where a voltage is not applied to the pad 17), the second input terminal of the NAND gate 13 connected to the pad 17 is rendered H level (power supply voltage Vcc level). This is caused by the application of the power supply voltage Vcc to the second input terminal of the NAND gate 13 connected to the pad 17 through the resistor element 19. Accordingly, the NAND gate 13 outputs a signal having a voltage level which is produced by inverting the voltage level of the verification pass signal VPASS which is applied to the first input terminal of the NAND gate 13. The voltage level of the output of the NAND gate 13 is inverted through the inverter 15. As a result, the output signal of the control signal output circuit 11 becomes a signal having the voltage level corresponding to that of the verification pass signal VPASS.

When a signal having L level (ground voltage Vss level) in voltage level is inputted to the pad 17, the second input terminal of the NAND gate 13 connected to the pad 17 is rendered L level. Accordingly, the NAND gate 13 outputs a signal of H level in voltage level regardless of the voltage level of the verification pass signal VPASS which is inputted to the first input terminal of the NAND gate 13. The voltage level of the output signal of the NAND gate 13 is inverted through the inverter 15. Accordingly, the output signal of the control signal output circuit 11 becomes a signal which is fixed to L level in voltage level regardless of the voltage level of the verification pass signal VPASS.

In such a manner, the voltage level of the output signal from the control signal output circuit 11 can be selectively fixed to the voltage level of the pad 17. The L level signal in voltage level is inputted to the pad 17 in the case of measurement of the maximum value of time needed for programming data.

The ground voltage Vss is applied to one of the electrodes, e.g., a source electrode of the transistor 25 constituting the status instruction circuit. The other electrode, e.g., a drain electrode of the transistor 25 is connected to one terminal of the resistor element 29 and a terminal 27 capable of outputting a signal outside the semiconductor memory. The power supply voltage Vcc is applied to the other terminal of the resistor element 29.

When the voltage level of the data write status signal WTF is L level (state where write processing is not instructed), the transistor 25 becomes unconductive. Accordingly, the terminal 27 has an H level voltage. When the voltage level of the data write status signal WTF is H level (state where write processing is instructed), the transistor 25 becomes conductive. Accordingly, the terminal 27 has L level voltage.

It can be known whether the semiconductor memory 1 is in a write status or not based on a voltage of the status signal outputted from the terminal 27 by the status instruction circuit composed of the transistor 25 and the resistor element 29.

Figure 2:
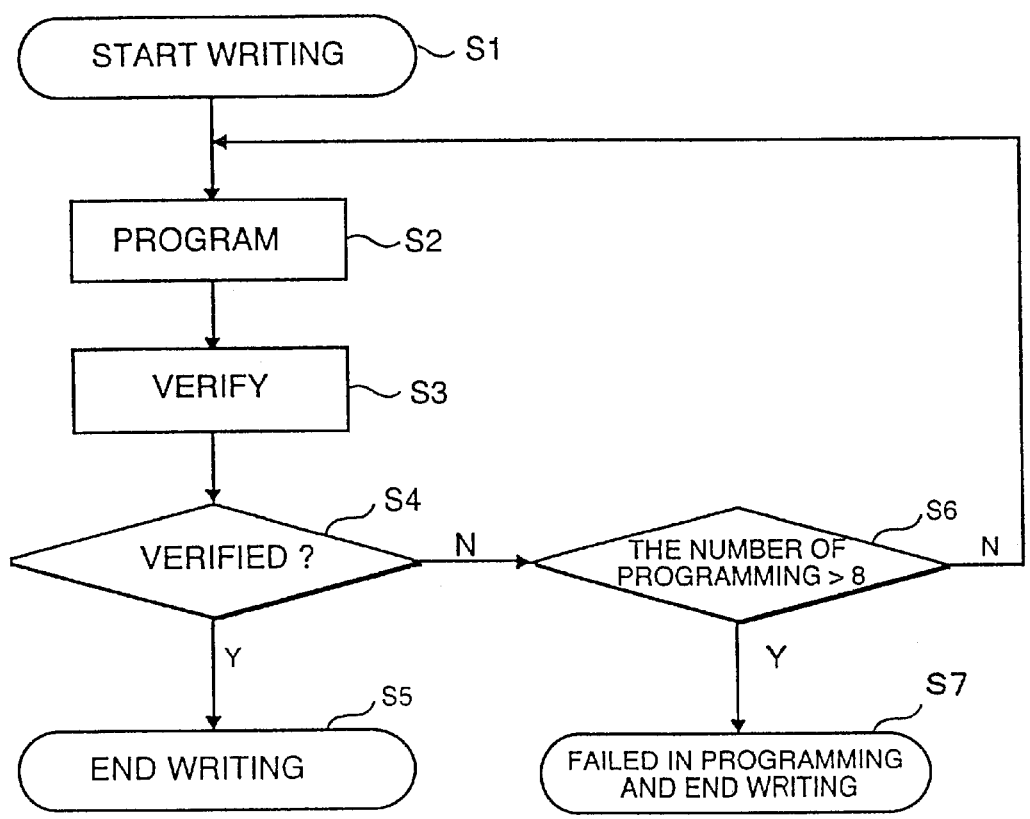
FIG. 2 is a flowchart showing the procedure of a program processing and a verification processing in the semiconductor memory in FIG. 1.

Procedures of the program processing and verification processing of the invention are now described. FIG. 2 is a flowchart showing the procedures of the program processing and verification processing.

In cases where given data is to program on the semiconductor memory 1, plural number of program processing and verification processing are repeatedly executed until the memory cell array 3 on which data is programmed reaches a given threshold voltage Vt. Assume that the maximum number of program processings are 8 times in the following explanation.

First, the semiconductor memory 1 starts a program processing mode based on a program instruction relative to the memory cell array 3 (Step S1). The write control circuit 7 programs given data relative to the memory cell array 3 (Step S2). In this instance, a count value of the write counter 9 is updated by 1.

The verification circuit 5 sends out the data voltage level check signal DVC to the memory cell array 3 and receives the data voltage level signal DV corresponding to the threshold voltage of a memory of the memory cell array 3 in which data is programmed from the memory cell array 3. The verification circuit 5 verifies whether a memory cell reaches a given threshold voltage Vt based on the data voltage level signal DV (Step S3).

As a result of the verification, if the verification circuit 5 judges that the memory cell array 3 reaches the threshold voltage Vt, the program processing is terminated or ended (Steps S4 and S5). Meanwhile, if the verification circuit 5 judges that the memory cell array 3 does not reach the threshold voltage Vt, the program processing of data is executed again. If the number of programming instructed by the write counter 9 is less than 8 times (the number of counting is 8), the program processing of data is executed again (Steps S4 and S6). If the number of programming is 8 times or more (in cases where the memory cell array 3 does not reach the threshold voltage Vt even in the verification processing immediately after the 8th program processing), it is judged that a series of program processings are failed and the program is terminated (Step S7).

Figure 3:
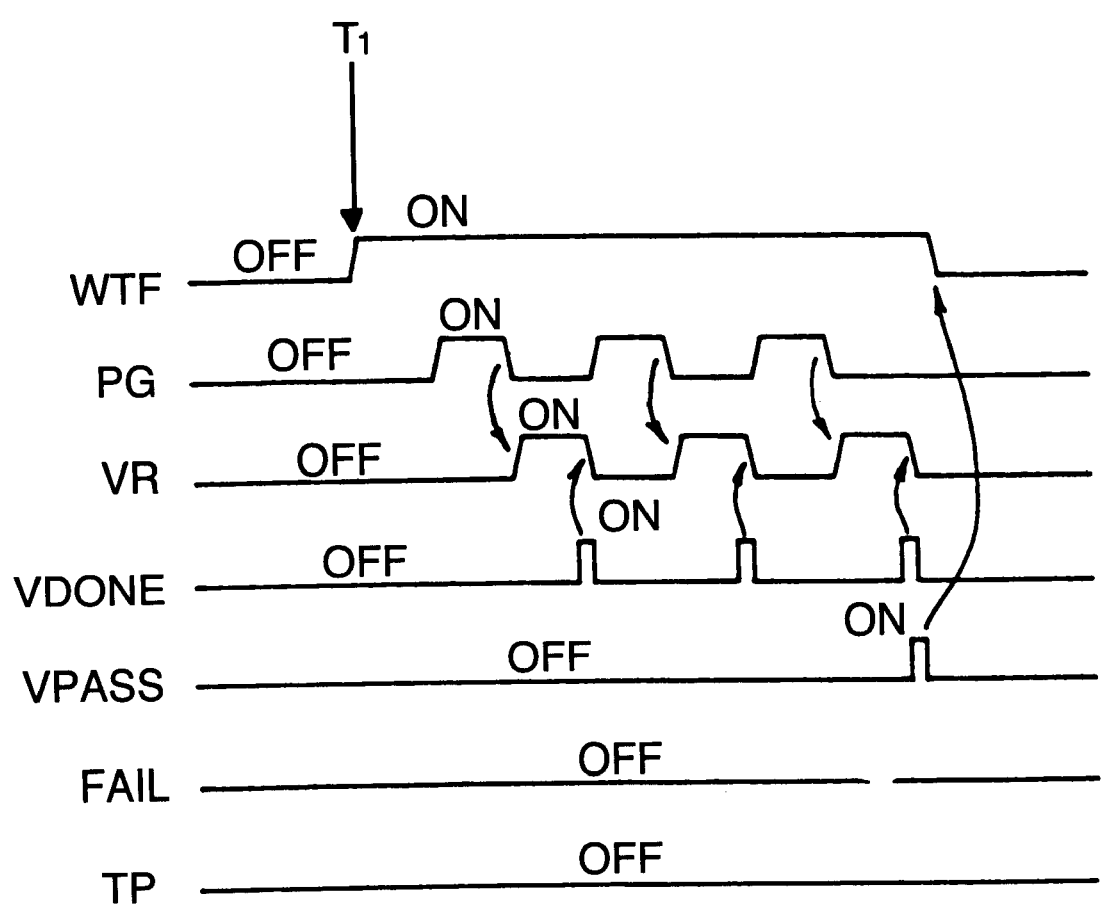
FIG. 3 is a timing chart showing a first example of a program processing and a verification processing in the semiconductor memory in FIG. 1.

Detailed operations of the program processing and verification processing in the semiconductor memory 1 are now explained in detail. FIG. 3 is a timing chart showing the operations of the program processing and verification processing in the semiconductor memory 1. FIG. 3 shows a case of a normal mode. The normal mode means a mode where the program processing of given data is executed by the write control circuit 7 relative to the memory cell array 3, and the verification processing of given data stored in the memory cell array 3 can be executed by the verification circuit 5 every program processing. In the normal mode, if the memory cell array 3 reaches the threshold voltage Vt, the program processing and verification processing are terminated. FIG. 3 shows a case where the memory cell array 3 reaches the threshold voltage Vt by the execution of the third program processing and verification processing.

In the normal mode, the pad 17 is in a release state (voltage level of the pad 17 is rendered H level).

If the semiconductor memory 1 is in a program processing mode, the write control circuit 7 outputs the H level data write status signal WTF in voltage level. The data write status signal WTF is inputted to the memory cell array 3, the write counter 9 and the gate electrode of the transistor 25.

Owing to the H level data write status signal WTF, the memory cell array 3 is changed to a write mode, the write counter 9 is changed to an activated state while the transistor 25 is conductive. The voltage level of the terminal 27 becomes L level in response to the state of the transistor 25. That is, the program processing and verification processing are respectively executed in the semiconductor memory 1 while the voltage level of the terminal 27 is L level.

Thereafter, the write control circuit 7 renders the voltage level of the data program signal PG L level during a given period of time. In this instant, given data is programmed on the memory cell array 3 in response to the H level data program signal PG.

Data to be programmed and an address for instructing a programming destination are transmitted to the memory cell array 3 through the write control circuit 7 or a circuit, not shown. The write counter 9 updates the count value by 1 count in response to the H level data program signal PG. Meanwhile, the count value of the write counter 9 is "0" in an initial state. Accordingly, the count value of the write counter 9 becomes "1".

When the first program processing relative to the memory cell array 3 is terminated, the voltage level of the data program signal PG becomes L level. The write control circuit 7 outputs the H level verification signal VR in voltage level in response to the change of the voltage level of the data program signal PG to L level. The verification circuit 5 is activated in response to the H level verification signal VR.

The verification circuit 5 outputs the data voltage level check signal DVC to the memory cell array 3. The memory cell array 3 outputs the data voltage level signal DV corresponding to the threshold voltage of a memory cell of the memory cell array on which data is programmed to the verification circuit 5.

The verification circuit 5 starts the verification processing in response to the data voltage level signal DV. The verification circuit 5 outputs a one shot pulse as the verification terminal signal VDONE when the verification processing is terminated. The write control circuit 7 renders the voltage level of the verification signal VR L level in response to the verification terminal signal VDONE.

Since the memory cell of the memory cell array 3 on which data is programmed does not reach the threshold voltage Vt in the first program processing, the verification circuit 5 keeps the voltage level of the verification pass signal VPASS L level. The verification pass signal VPASS is inputted to the NAND gate 13 of the control signal output circuit 11.

Here, the pad 17 is still in the release state as set forth above. Accordingly, the power supply voltage Vcc is applied to one input terminal of the NAND gate 13 through the resistor element 19. One input terminal of the NAND gate 13 is fixed to H level. The NAND gate 13 outputs a signal which is produced by inverting the voltage level of the verification pass signal VPASS. The voltage level of the output of the NAND gate 13 is further inverted by the inverter 15. Accordingly, the output signal of the control signal output circuit 11 becomes a signal having a voltage level which is the same as that of the verification pass signal VPASS without changing logically the verification pass signal VPASS.

Since the voltage level of the verification pass signal VPASS is L level, the write control circuit 7 keeps the voltage level of the data write status signal WTF H level. Since the first program processing is judged as a failure by the verification circuit 5, the write control circuit 7 programs again given data on the memory cell array 3. Accordingly, the write control circuit 7 renders the voltage level of the data program signal PG H level for a given period of time. The write counter 9 updates the count value by 1 count in response to the H level data program signal PG. As a result, the count value of the write counter 9 becomes "2". Subsequently, the verification processing and program processing are repeatedly executed while the program processing is executed until a memory cell reaches a given threshold voltage Vt. The operations of the respective components are the same as those of the first program processing and verification processing during this period of time.

For example, assume that a memory cell reaches a given threshold voltage Vt in the third program processing and verification processing as shown in FIG. 3. The verification circuit 5 outputs the one shot pulse as the verification terminal signal VDONE in the manner set forth above. In this instance, the verification circuit 5 outputs the verification pass signal VPASS which is rendered temporarily H level (one shot pulse) in the voltage level. The verification pass signal VPASS is inputted to the NAND gate 13 of the control signal output circuit 11.

Since the pad 17 is in a release state as set forth above, one input terminal of the NAND gate 13 is fixed to H level. Accordingly, the NAND gate 13 outputs a signal which is produced by inverting the voltage level of the verification pass signal VPASS. The voltage level of the output of the NAND gate 13 is further inverted by the inverter 15. Accordingly, the output signal of the control signal output circuit 11 becomes a signal having a voltage level which is the same as that of the verification pass signal VPASS without changing logically the verification pass signal VPASS.

The write control circuit 7 substantially renders the voltage level of the data write status signal WTF L level in response to the H level verification pass signal VPASS in voltage level. Accordingly, the program processing is terminated assuming that given data is normally stored in the memory cell of the memory cell array 3. Further, since the transistor 25 becomes unconductive, the voltage level of the terminal 27 is rendered H level. The count value of the write counter 9 is substantially reset (count value is returned to "0") in response to the H level verification pass signal VPASS in voltage level.

Figure 4:
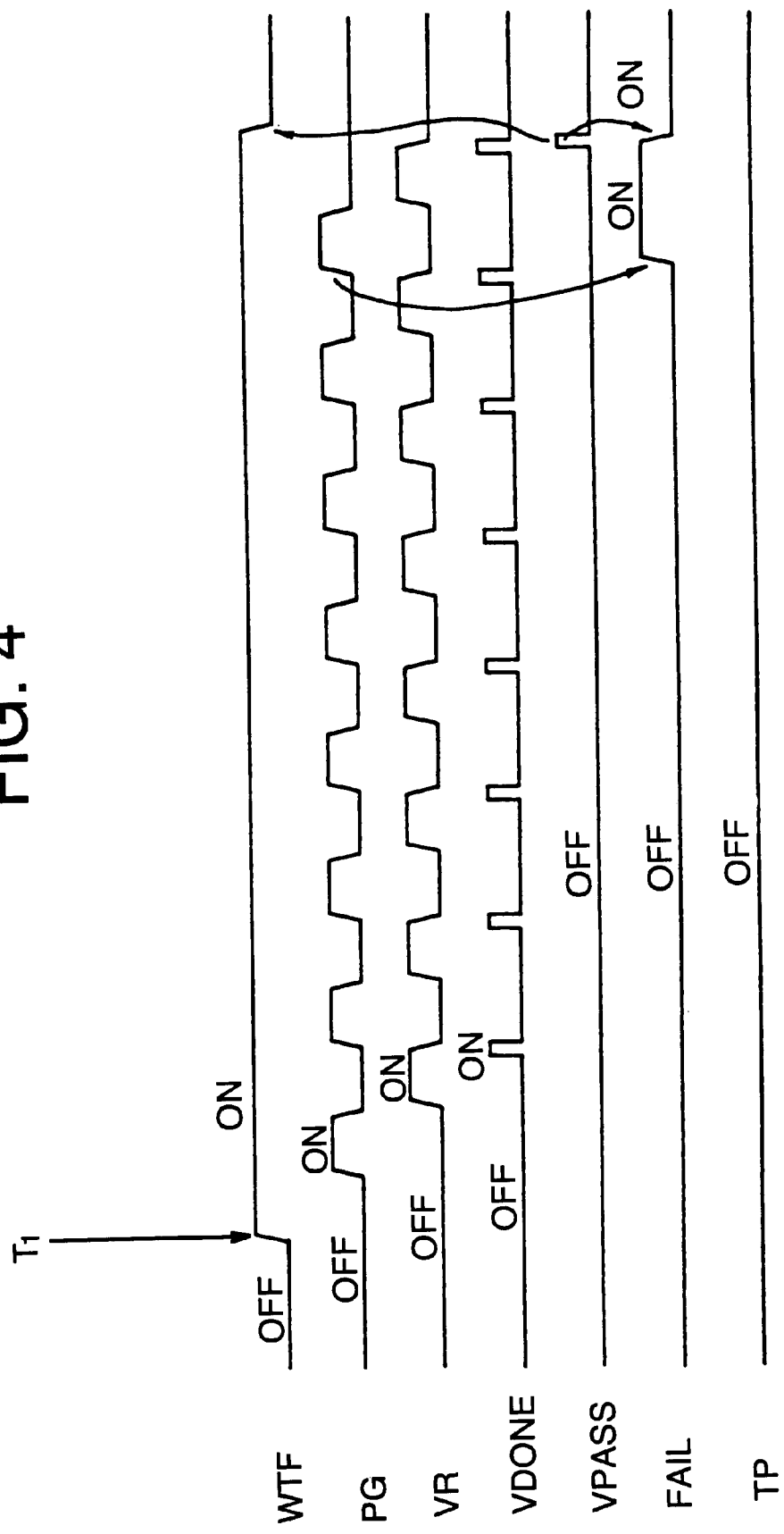
FIG. 4 is a timing chart showing a second example of a program processing and a verification processing in the semiconductor memory in FIG. 1.

The operations as set forth above is an example of the program processing and verification processing in the semiconductor memory 1. Next, operations of the 8th program processing and verification processing in the semiconductor memory 1, namely, when a memory cell first reaches a given threshold voltage Vt at the maximum number of programs which are set by the write counter 9 will be explained with reference to FIG. 4.

The operations of respective components of the semiconductor memory 1 in the first to seventh program processings and verification processing are the same as those in the first and second program processing and verification processing in FIG. 3.

If a memory cell does not reach the threshold voltage Vt in the seventh verification processing, the write control circuit 7 renders the voltage level of the data program signal PG H level for executing the eighth program processing. The write counter 9 updates the count value to change it to "8" in response to the H level data program signal PG. The write counter 9 renders the voltage level of the data program fail signal FAIL H level since the count value reaches the preset maximum number of programs. That is, the voltage level of the data program fail signal FAIL is rendered H level in synchronization with the leading edge of the H level of the data program signal PG.

Thereafter, assume that a memory cell reaches a given threshold voltage Vt in the eighth program processing and verification processing. The verification circuit 5 outputs a one shot pulse as the verification terminal signal VDONE in the same manner set forth above. In this instance, the verification circuit 5 outputs the verification pass signal VPASS having a voltage level which is temporarily rendered H level (one shot pulse). The output of the control signal output circuit 11 is the same as the voltage level of the verification pass signal VPASS. The output signal of the control signal output circuit 11 is inputted to the write control circuit 7 and write counter 9.

The write control circuit 7 renders the voltage level of the data write status signal WTF and data program fail signal FAIL respectively L level. As a result, the program processing is terminated assuming that given data is normally stored in the memory of the memory cell array 3. Further, since the transistor 25 also becomes unconductive, the voltage level of the terminal 27 is rendered H level. The count value of the write counter 9 is reset (count value is returned to "0") in response to the H level verification pass signal VPASS in voltage level.

Figure 5:
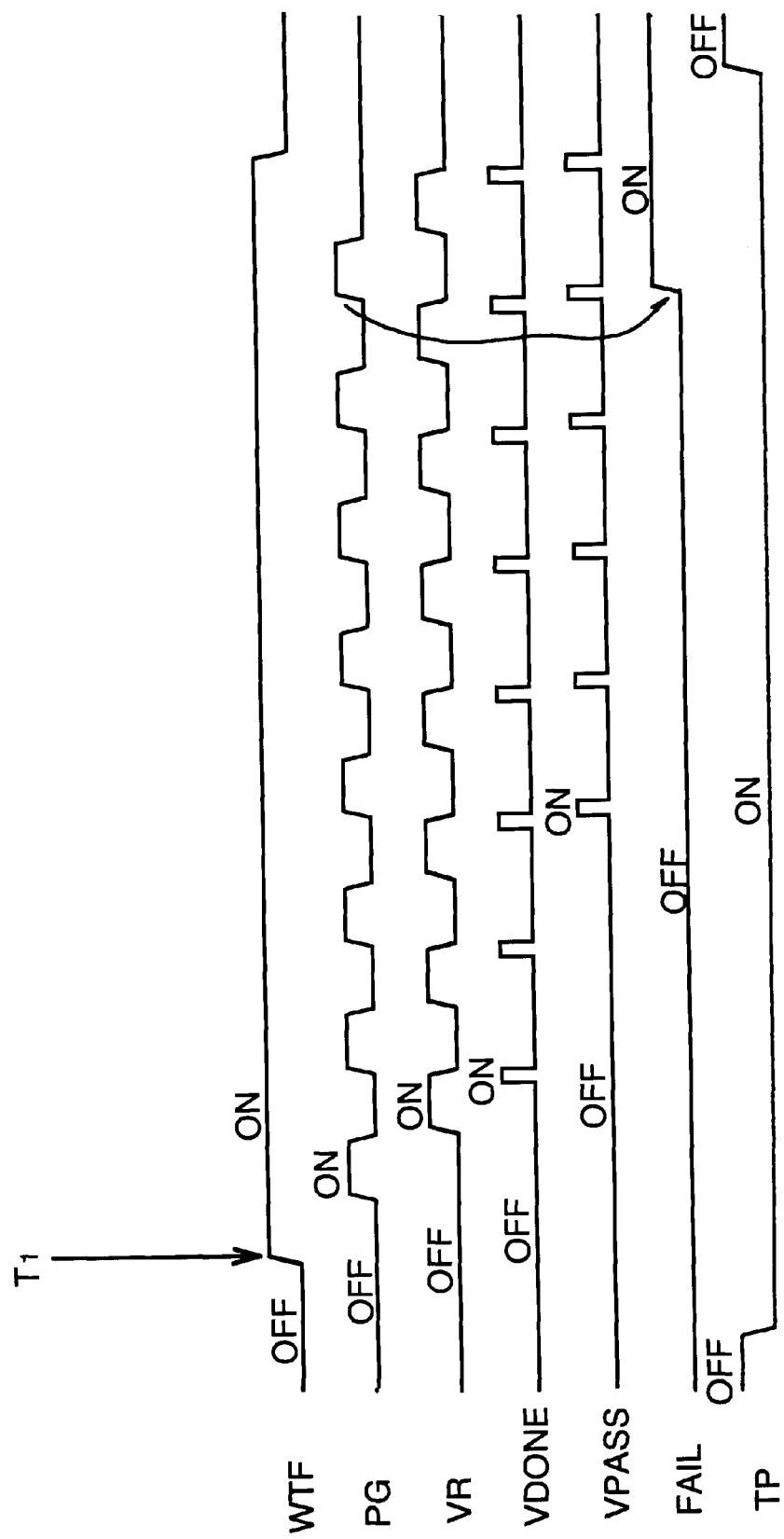
FIG. 5 is a timing chart showing a third example of a program processing and a verification processing in the semiconductor memory in FIG. 1.

Next, an operation in a mode for measuring the maximum time for executing the program processing and verification processing in the semiconductor memory 1, namely, operation in a so-called test mode will be now described hereinafter. FIG. 5 is a timing chart for explaining the operation of the program processing and verification processing in the semiconductor memory 1 in the test mode.

In the test mode, the ground voltage Vss level signal is inputted to the pad 17 (voltage level of the pad 17 is rendered L level).

If the semiconductor memory 1 is in a program processing mode, the write control circuit 7 outputs the H level data write status signal WTF in voltage level at time t1. The data write status signal WTF is inputted to the memory cell array 3, the write counter 9 and the gate electrode of the transistor 25.

Upon reception of the H level data write status signal WTF, the memory cell array 3 is changed to a write mode, the write counter 9 is activated and the transistor 25 is conductive. The voltage level of the terminal 27 is rendered L level in response to the state of the transistor 25. That is, the program processing and verification processing are executed in the semiconductor memory 1 while the voltage level of the terminal 27 is kept L level.

Thereafter, the write control circuit 7 renders the voltage level of the data program signal PG H level for a given period of time. In this instance, given data is programmed on the memory cell array 3 in response to the H level data program signal PG. Data to be programmed and an address for instructing a programming destination are transmitted to the memory cell array 3 through the write control circuit 7 or a circuit, not shown. The write counter 9 updates the count value by 1 count in response to the H level data program signal PG. Meanwhile, the count value of the write counter 9 is "0" in an initial state. Accordingly, the count value of the write counter 9 becomes "1".

When the first program processing relative to the memory cell array 3 is terminated, the voltage level of the data program signal PG becomes L level. The write control circuit 7 outputs the H level verification signal VR in voltage level in response to the change of the voltage level of the data program signal PG to L level. The verification circuit 5 is activated in response to the H level verification signal VR.

The verification circuit 5 outputs the data voltage level check signal DVC to the memory cell array 3. The memory cell array 3 outputs the data voltage level signal DV corresponding to the threshold voltage of a memory cell of the memory cell array 3 on which data is programmed to the verification circuit 5.

The verification circuit 5 starts the verification processing in response to the data voltage level signal DV. The verification circuit 5 outputs a one shot pulse as the verification terminal signal VDONE when the verification processing is terminated. The write control circuit 7 renders the voltage level of the verification signal VR L level in response to the verification terminal signal VDONE.

If a memory cell of the memory cell array 3 on which data is programmed reaches the given threshold voltage Vt in the third program processing, the verification circuit 5 temporarily renders the voltage level of the verification pass signal VPASS H level. The verification pass signal VPASS is inputted to the NAND gate 13 of the control signal output circuit 11.

Here, the voltage level of the pad 17 is L level as set forth above. Accordingly, the ground voltage Vss is applied to one input terminal of the NAND gate 13. The one input terminal of the NAND gate 13 is fixed to L level. Accordingly, the output signal of the NAND gate 13 is fixed to H level regardless of the voltage level of the verification pass signal VPASS. The voltage level of the output signal of the NAND gate 13 is further inverted by the inverter 15. Accordingly, the output signal of the control signal output circuit 11 becomes an L level signal in voltage level regardless of the voltage level of the verification pass signal VPASS.

Accordingly, even if the memory cell of the memory cell array 3 on which data is programmed reaches a given threshold voltage Vt in the third program processing, the voltage level of the output signal of the control signal output circuit 11 keeps L level. This substantially the same as a case where the write control circuit 7 and write counter 9 receive the L level verification pass signal VPASS. Accordingly, the write control circuit 7 keeps the voltage level of the data write status signal WTF H level. Further, since the transistor 25 is conductive, the voltage level of the terminal 27 is kept L level. Since the write counter 9 substantially receives the L level verification pass signal VPASS in voltage level, the count value of the write counter 9 is not reset.

In such a manner, even if a memory cell of the memory cell array 3 on which data is programmed reaches a given threshold voltage Vt in any of the first to seventh program processings by rendering the voltage level of the pad 17 L level, it is possible to surely execute the program processing and verification processing in the semiconductor memory 1 up to the preset maximum number of times (eight times in this example).

At the time when the eighth program processing is executed (at the time when the voltage level of the data program signal PG instructing the eighth program processing is rendered H level), the write counter 9 renders the voltage level of the data program fail signal FAIL H level.

Thereafter, the verification circuit 5 outputs the verification terminal signal VDONE serving as one shot pulse instructing the termination of the eighth verification processing. The write control circuit 7 renders the voltage level of the data write status signal WTF L level so as to receive the verification terminal signal VDONE in a state where it receives the H level data program fail signal FAIL in voltage level regardless of the voltage level of the output signal of the control signal output circuit 11. As a result, the program processing is terminated upon completion of execution of the maximum number of program processings.

As explained above, a normal mode and a test mode can be switched in response to the voltage level of the pad 17 in the semiconductor memory 1 of the first embodiment of the invention. If the voltage level of the pad 17 is H level, the semiconductor memory 1 operates to terminate the program processing when the memory cell of the memory cell array 3 on which data is programmed reached a given threshold voltage Vt by the execution of the verification processing. If the voltage level of the pad 17 is L level, the semiconductor memory 1 operates to terminate upon completion of the preset maximum number of program processings regardless of whether the memory cell of the memory cell array 3 on which data is programmed reached the given threshold voltage Vt by the verification processing. In this instance, if the voltage level of a signal outputted through the terminal 27 is measured, the maximum time involved in programming data in the semiconductor memory 1 can be easily grasped.

It is preferable not to perform wire bonding between the pad 17 which is formed on a semiconductor chip and an external terminal in a packaging process of the semiconductor memory 1. The reason is that the semiconductor memory 1 is prevented from erroneously transferring to a test mode under the program processing of data in the normal mode after the measurement of the maximum time for programming data.

The measurement of the maximum time for executing in the program processing of data can be realized by the provision of the control signal output circuit 11 which is constituted by a small number of circuit devices.

[Second Embodiment]

Figure 6:
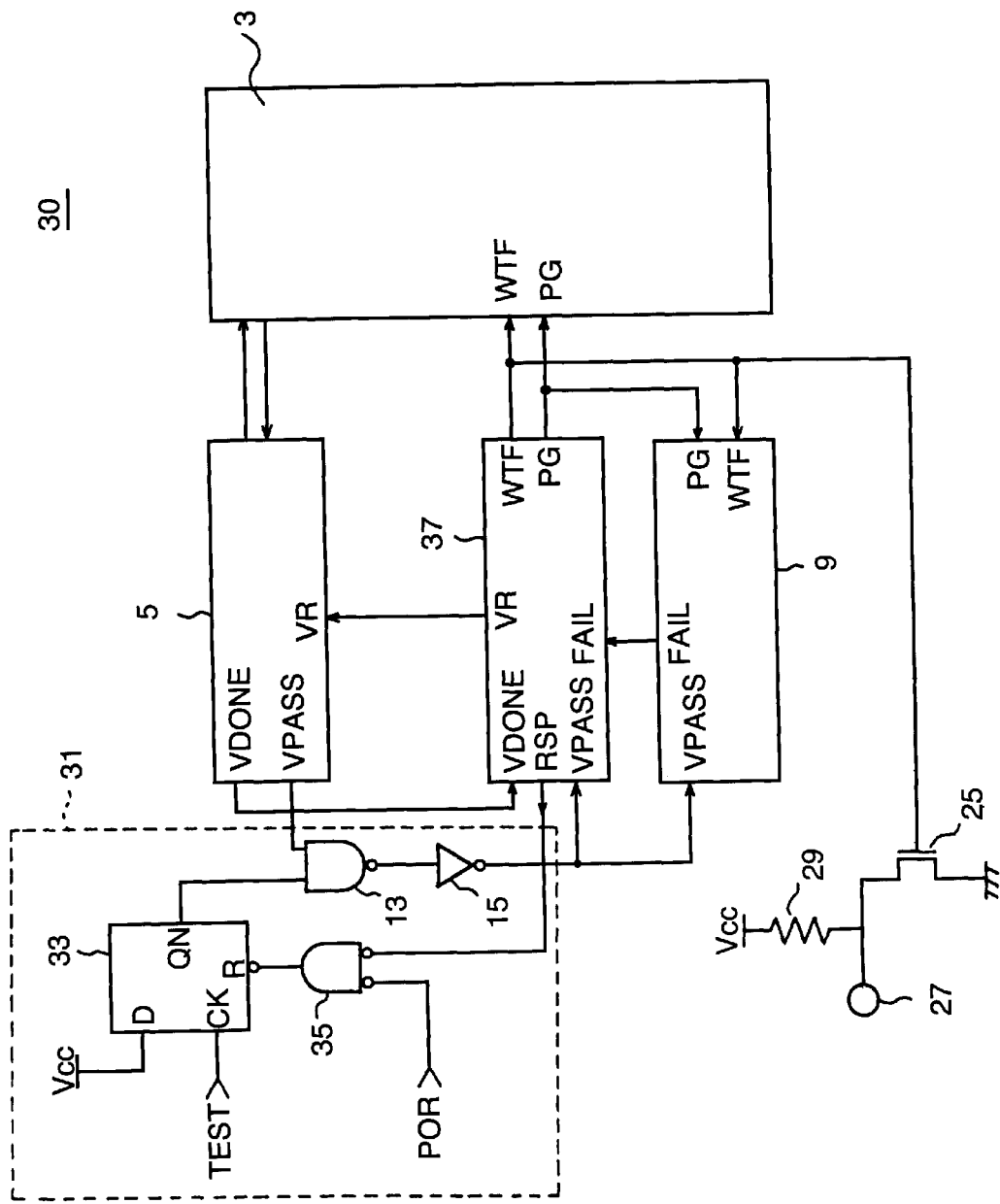
FIG. 6 is a block diagram showing the construction of a semiconductor memory according to a second embodiment of the invention.

The construction of a semiconductor memory according to a second embodiment of the invention is illustrated in FIG. 6. A semiconductor memory 30 is a nonvolatile semiconductor memory capable of erasing data by the batch.

The semiconductor memory 30 is provided with a control signal output circuit 31 which is different from the control signal output circuit 11 in the first embodiment in respect of a circuit configuration. The write control circuit 7 in FIG. 1 is changed to a write control circuit 37 for outputting a reset pulse RSP. Other components in FIG. 6 are the same as those in FIG. 1.

The control signal output circuit 31 in FIG. 6 includes a NAND gate 13 and an inverter 15 which are the same as those of the control signal output circuit 11. The control signal output circuit 31 is provided with a D-type flip-flop 33 and a NOR gate 35 instead of the resistor element 19 and the pad 17 of the control signal output circuit 11 in FIG. 1.

The verification pass signal VPASS outputted from the verification circuit 5 is inputted to one input terminal of the NAND gate 13. Another input terminal of the NAND gate 13 is connected to an inversion output terminal QN of the flip-flop 33. An output of the NAND gate 13 is connected to the inverter 15. An output of the inverter 15 becomes an output signal of the control signal output circuit 31.

The power supply voltage Vcc is applied to a data terminal D of the flip-flop 33. A test signal TEST instructing a test mode, e.g. as a selection signal is inputted to a clock terminal CK of the flip-flop 33. An output of the NOR gate 35 is connected to a reset terminal R of the flip-flop 33.

In an initial state (or reset state) of the flip-flop 33, an H level signal in voltage level is outputted from the inversion output terminal QN. The flip-flop 33 renders the voltage level of the signal outputted from the inversion output terminal QN L level in response to the leading edge of the test signal TEST. The flip-flop 33 is reset when the L level signal in voltage level is inputted to the reset terminal R thereof. The reset means the voltage level of the inversion output terminal QN is rendered H level. The flip-flop 33 functions as a generation circuit for generating a signal outputted from the inversion output terminal QN as a first control signal.

The reset pulse RSP is inputted to one input terminal of the NOR gate 35. The reset pulse RSP is a signal for generating a one shot pulse which is temporarily rendered H level when the write control circuit 37 terminated the execution of program processing relative to the memory cell array 3. A power-on reset signal POR is inputted to another input terminal of the NOR gate 35. The power-on reset signal POR is a signal for generating a one shot pulse which is temporarily rendered H level in voltage level when the semiconductor memory 30 is powered on.

The NOR gate 35 outputs an L level output signal in voltage level when the reset pulse RSP or power-on reset signal POR generates the one shot pulse. The NOR gate 35 outputs an H level output signal in voltage level when the reset pulse RSP or power-on reset signal POR does not generate the one shot pulse.

As is understood from the above explanation, the flip-flop 33 is reset when the reset pulse RSP or power-on reset signal POR generates a one shot pulse.

Figure 7:
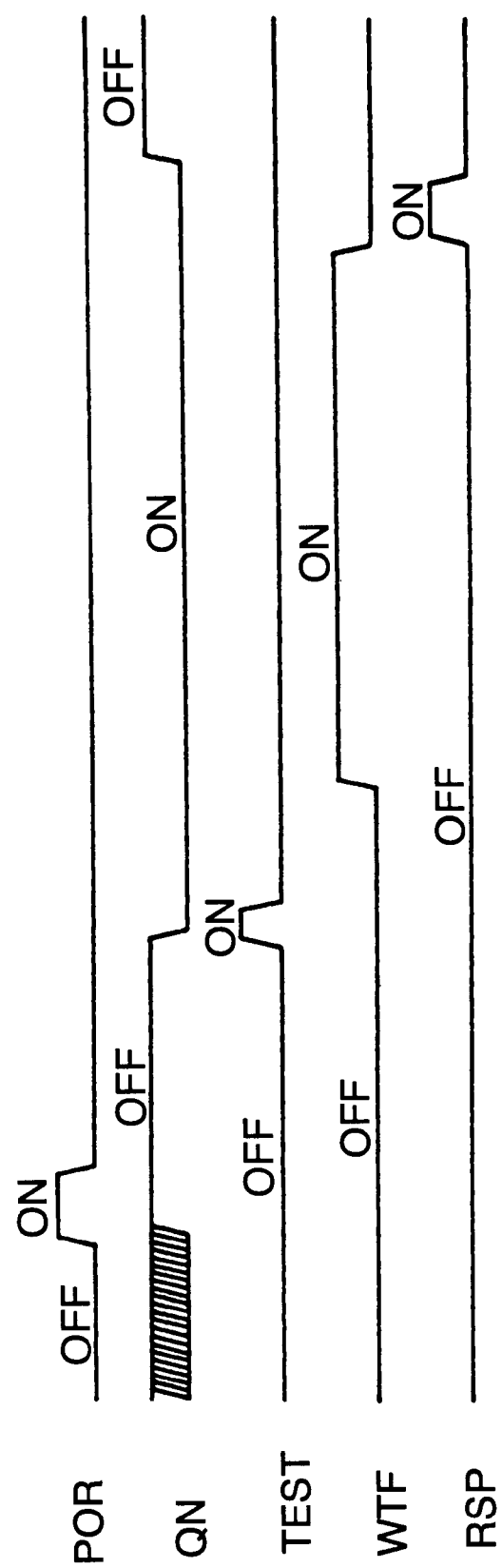
FIG. 7 is a timing chart showing an example of a program processing and a verification processing in the semiconductor memory in FIG. 6.

Next, operations of a program processing and verification processing in the semiconductor memory 30 of the second embodiment of the invention are described hereinafter. FIG. 7 is a timing chart showing the operations of the program processing and verification processing in the semiconductor memory 30.

First at time t1 in FIG. 7, when the semiconductor memory 30 is powered on, the power-on reset signal POR becomes a one shot pulse. The voltage level of the output signal of the NOR gate 35 is temporarily rendered L level in response to the power-on reset signal POR. Since the write control circuit 37 does not execute the program processing of data relative to the memory cell array 3, the L level reset pulse RSP in voltage level is inputted to another input terminal of the NOR gate 35. The flip-flop 33 is reset in response to the output of the NOR gate 35. The voltage level of the output signal from the inversion output terminal QN of the flip-flop 33 is rendered H level. The voltage level of the test signal TEST is kept L level during the operations.

That is, the semiconductor memory 30 is in the same state as the normal mode as explained in the first embodiment of the invention. In this state, if the program processing and verification processing are executed, the semiconductor memory 1 operates to terminate the program processing when a memory cell of the memory cell array 3 on which data is programmed reaches a threshold voltage by the execution of the verification program.

A test mode for measuring the maximum time for executing the program processings of data in the semiconductor memory 30 is now described. Since neither the reset pulse RSP nor power-on reset signal POR generates a one shot pulse, the voltage level of the output signal of the NOR gate 35 is H level. The voltage level of the test signal TEST is rendered H level for a given period of time. The voltage level of the inversion output terminal QN of the flip-flop 33 is rendered L level in response to the leading edge of the voltage level of the test signal. The flip-flop 33 keeps the voltage level of the inversion output terminal QN until the L level signal in voltage level is inputted to the reset terminal R.

Thereafter, the program processing of data and verification processing are executed by the verification circuit 5, the write control circuit 37 and the write counter 9 respectively relative to the memory cell array 3. If the memory cell of the memory cell array 3 on which data is programmed reaches the threshold voltage Vt in any of the first to seventh program processings, the verification circuit 5 temporarily renders the voltage level of the verification pass signal VPASS H level. The verification pass signal VPASS is inputted to the NAND gate 13.

The voltage level of the inversion output terminal QN of the flip-flop 33 is kept L level. As a result, one input terminal of the NAND gate 13 is fixed to the L level. The output of the NAND gate 13 is fixed to H level regardless of the voltage level of the verification pass signal VPASS. The voltage level of the output of the NAND gate 13 is further inverted by the inverter 15. Accordingly, the output of the control signal output circuit 31 becomes an L level signal in voltage level regardless of voltage level of the verification pass signal VPASS.

Accordingly, even if the memory cell of the memory cell array 3 on which data is programmed reaches the threshold voltage Vt in any of the first to seventh program processings, the voltage level of the output signal of the control signal output circuit 31 is kept L level. This is substantially the same as a case where the write control circuit 37 and write counter 9 receive the L level verification pass signal VPASS in voltage level. As a result, the write control circuit 37 keeps the voltage level of the data write status signal WTF H level. Since the transistor 25 is also conductive, the voltage level of the terminal 27 is kept L level. Since the write counter 9 substantially receives the L level verification pass signal VPASS, the count value of the write counter 9 is not reset.

As mentioned above, since the voltage level of the inversion output terminal QN of the flip-flop 33 is rendered L level, even if the memory cell of the memory cell array 3 on which data is programmed reaches the threshold voltage Vt in any of the first to seventh program processings, the program processing and verification processing can be surely executed in the semiconductor memory 1 up to the preset maximum number of times (eight times in this example).

The write counter 9 renders the voltage level of the data program fail signal FAIL H level at the time when the eighth program processing is executed (at the time when the voltage level of the data program signal PG is rendered H level).

Thereafter, the verification terminal signal VDONE as a one shot pulse instructing the termination of the eighth verification processing is outputted. Since the write control circuit 37 receives the verification terminal signal VDONE in a state where it receives the H level data program fail signal FAIL in voltage level, it renders the voltage level of the data write status signal WTF L level regardless of the voltage level of the output signal of the control signal output circuit 31. Accordingly, the program processing is terminated after the maximum number of program processings are executed. Further, the write control circuit 37 outputs the reset pulse RSP which is temporarily rendered H level in voltage level in synchronization with the data write status signal WTF which is rendered L level in voltage level.

The voltage level of the output signal of the NOR gate 35 is temporarily rendered L level in response to the reset pulse RSP. The flip-flop 33 is reset in response to the voltage level of the output signal of the NOR gate 35. The voltage level of the inversion output terminal QN of the flip-flop 33 is rendered H level.

As explained above, in the semiconductor memory 30 of the second embodiment, the normal mode and the test mode can be easily switched in response to the test signal TEST. If the voltage level of the test signal TEST is kept a given level, the semiconductor memory 30 operates to terminate the program processing since the memory cell of the memory cell array 3 on which data is programmed reaches the threshold voltage Vt by the verification processing. In cases where the voltage level of the test signal TEST is raised from L level to H level, the semiconductor memory 30 operates to terminate after the preset maximum number of program processings are executed regardless of whether the memory cell of the memory cell array 3 on which data is programmed reaches the threshold voltage Vt by the verification processing. In this instance, if the voltage level of a signal outputted from the terminal 27 is measured, the maximum time for programming data can be easily grasped.

Further, since the test signal TEST can be generated by a command signal from the outside of the semiconductor memory 30, the maximum time for programming data can be measured even after the semiconductor memory 30 is packaged.

Although preferred embodiments of the invention have been explained with reference to the accompanied drawings, the invention is not limited to the these embodiments.

For example, although it is explained in the embodiments that the maximum number of program processings of data is eight times, this is not limited to eight times. If data representing the maximum number of program processings which is set by the write counter 9 can be changed, the maximum number of program processing can be easily changed.

The semiconductor memories 1 and 31 are structured to measure the time for executing the maximum number of program processings of data, but they can be applied to a case where the time for executing arbitrary number of program processing is measured. For example, data representing the maximum number of times in the program processing which is set by the write counter 9 may be set to an arbitrary number.

Still further, although the nonvolatile semiconductor memory capable of erasing data by the batch has been explained, the invention can be applied to other nonvolatile semiconductor memories or a semiconductor memory capable of verifying data stored therein.

The circuit configuration of the control signal output circuits 11 and 31 is not limited to those of the embodiments, but it can be changed to any circuit configuration which satisfies the same function as the control signal output circuits 11 and 31.

More still further, the resistor elements 19 and 29 may be structured that a transistor is always activated.

What is claimed is:

1. A semiconductor memory capable of verifying data stored therein comprising:
   a memory cell array comprising a plurality of memory cells in which data is stored;
   a verification circuit that verifies data stored in the memory cell array and outputs a fit signal indicative of a result of verification, the fit signal selectively having a first voltage level or a second voltage level based on the result of verification;
   a control signal output circuit that receives the fit signal and outputs a second control signal having a voltage level which is selectively controlled to a voltage level corresponding to a voltage level of the fit signal or the first voltage level, in response to a first control signal; and
   a counter that counts a number of verification processing of data by the verification circuit according to the second control signal, said counter updating the number of verification processing if the second control signal having the first voltage level is input thereto.

2. The semiconductor memory according to claim 1, wherein said verification circuit outputs the fit signal having the first voltage level when the result of verification is not satisfied, and outputs the fit signal having the second voltage level when the result of verification is satisfied.

3. The semiconductor memory according to claim 1, wherein said first control signal is inputted from one of pads provided in a semiconductor chip constituting the semiconductor memory, said pad is not connected to an external terminal in a packaged state.

4. The semiconductor memory according to claim 1, wherein said semiconductor memory includes a write control circuit for outputting a write signal for instructing writing of data on the memory cell array, said write control circuit continuing to write data on the memory cell array when the second control signal is the first voltage level.

5. The semiconductor memory according to claim 4, wherein said counter counts based on a status of a signal outputted from the write control circuit when writing data.

6. The semiconductor memory according to claim 4, wherein said semiconductor memory has a status instruction circuit for outputting a signal representing an output status of the write signal.

7. The semiconductor memory according to claim 1, wherein said control signal output circuit includes a logic circuit for receiving the first control signal and the fit signal, said logic circuit outputting a signal for rendering a voltage level of the second control signal to be the first voltage level when a voltage level of the first control signal is the second voltage level, and for rendering a voltage level of the second control signal to be a voltage level corresponding to the voltage level of the fit signal when the voltage level of the first control signal is a third voltage level.

8. The semiconductor memory according to claim 7, wherein said control signal output circuit includes a generation circuit that generates the first control signal, said generation circuit generating the first control signal having a voltage level in response to a select signal.

9. The semiconductor memory according to claim 8, wherein said generation circuit changes the voltage level of the first control signal when the semiconductor memory is powered on.

10. The semiconductor memory according to claim 7, wherein said semiconductor memory includes a write control circuit for outputting a write signal for instructing to write data on the memory cell array, said write control circuit continuing to write data on the memory cell array when the second control signal is the first voltage level.

11. The semiconductor memory according to claim 10, wherein said semiconductor memory has a status instruction circuit for outputting a signal representing an output status of the write signal.

12. The semiconductor memory according to claim 10, wherein said counter outputs an instruction signal for instructing that a count value thereof exceeds a preset number, and said write control circuit is controlled by the instruction signal.

13. The semiconductor memory according to claim 12, wherein said semiconductor memory has a status instruction circuit for outputting a signal representing an output status of the write signal.

14. The semiconductor memory according to claim 10, wherein said control signal output circuit includes a generation circuit that generates the first control signal, said generation circuit generating the first control signal having a voltage level in response to a select signal.

15. The semiconductor memory according to claim 14, wherein said generation circuit changes the voltage level of the first control signal in response to a signal outputted from the write control circuit.

16. The semiconductor memory according to claim 15, wherein said semiconductor memory has a status instruction circuit for outputting a status signal representing an output status of the write signal.

17. The semiconductor memory according to claim 16, wherein said status signal is connected to a terminal provided on the semiconductor memory.

* * * * *